(12) United States Patent
Forbes (10) Patent No.: US 6,198,681 B1
(45) Date of Patent: Mar. 6, 2001

(54) SENSE AMPLIFIER FOR LOW VOLTAGE MEMORY ARRAYS

(75) Inventor: Leonard Forbes, Corvallis, OR (US)

(73) Assignee: Micron, Boise, ID (US)

( * ) Notice: Subject to any disclaimer, the term of this patent is extended or adjusted under 35 U.S.C. 154(b) by 0 days.

(21) Appl. No.: 09/513,936

(22) Filed: Feb. 28, 2000

(51) Int. Cl.[7] ....................................................... G11C 7/00
(52) U.S. Cl. .......................... 365/205; 365/207; 365/196
(58) Field of Search .................................... 365/205, 210, 365/207, 208, 226, 196, 190, 189.09

(56) References Cited

U.S. PATENT DOCUMENTS

| 5,325,331 | 6/1994 | Parkinson et al. | 365/189.06 |
|---|---|---|---|
| 5,339,274 | 8/1994 | Dhong et al. | 365/203 |
| 5,343,433 | * 8/1994 | Duvvury et al. | 365/205 |
| 5,396,467 | 3/1995 | Liu et al. | 365/210 |
| 5,416,371 | 5/1995 | Katayama et al. | 327/57 |
| 5,627,785 | 5/1997 | Gilliam et al. | 365/189.01 |

OTHER PUBLICATIONS

Lu, et al. "Half–$V_{dd}$ Bit–Line Sensing Scheme in CMOS DRAMs." IEEE Journal of Solid–State Circuits. 1984. pp. 451–454.

Dhang, et al. "High–Speed Sensing Scheme for CMOS DRAMs." IEEE Journal of Solid–State Circuits. 1987. p. 0018.

* cited by examiner

Primary Examiner—David Nelms
Assistant Examiner—David Lam
(74) Attorney, Agent, or Firm—Knobbe, Martens, Olson & Bear, LLP (57) ABSTRACT

A sense amplifier is coupled to a memory array comprising a first plurality of cells coupled to a first bit line and a dummy cell coupled to a second bit line. The sense amplifier includes a first source follower comprising a first current sink and a first source follower transistor having a gate coupled to the first bit line and a second source follower comprising a second current sink and a second source follower transistor having a gate coupled to the second bit line. The sense amplifier also includes a first n-channel transistor having a gate coupled to the first bit line and a first p-channel transistor having a gate coupled to the first bit line through the first source follower. The sense amplifier also includes a second n-channel transistor having a gate coupled to the second bit line and a second p-channel transistor having a gate coupled to the second bit line through the second source follower.

19 Claims, 4 Drawing Sheets

SENSE AMPLIFIER FOR LOW VOLTAGE MEMORY ARRAYS

BACKGROUND OF THE INVENTION

1. Field of the Invention

The present invention relates in general to memory arrays and relates more specifically to sense amplifiers for low voltage memory arrays.

2. Description of the Related Art

Memory devices, such as Dynamic Random Access Memory (DRAM) devices, are commonly used to store information in integrated circuits. A conventional DRAM device includes a plurality of individual memory cells configured in an array. A memory array typically comprises a configuration of intersecting rows and columns, referred to as word lines and bit lines, respectively. The word lines and bit lines are fabricated as metal lines on an integrated circuit and are coupled to the memory cells for accessing the data stored in the memory cells.

Typically, each memory cell in the array comprises a capacitor capable of holding a charge and an access transistor for accessing the charge on the capacitor. Data bits are represented by the presence or absence of a charge on the capacitor. For example, a charge stored on the capacitor may correspond to a logical "1", while the absence of charge stored on the capacitor may correspond to a logical "0". Data can be stored in the memory cells during a write operation or retrieved from the memory cells during a read operation.

During a read operation, the desired memory cell is selected, or addressed. If the capacitor in the addressed memory cell is charged, then the capacitor discharges onto the bit line associated with the memory cell, which causes a change in the voltage on the bit line. On the other hand, if the capacitor in the addressed memory cell is not charged, then the voltage on the bit line associated with the memory cell remains constant. The change in voltage on the bit line (or lack thereof) can be detected to determine the state of the capacitor in the addressed memory cell, which indicates the value of the data bit stored in the memory cell.

A sense amplifier can be used to improve accuracy when determining the state of the capacitor in a particular cell. Typically, a sense amplifier includes a pair of n-channel transistors that have a cross-coupled gate and drain configuration and a pair of p-channel transistors that also have a cross-coupled gate and drain configuration. Due to the positive feedback of this transistor configuration, a sense amplifier can sense and amplify slight changes in the voltage on a bit line caused by the discharge of a capacitor onto the bit line.

Memory devices typically require a power supply, which provides a power supply voltage, referred to as $V_{DD}$, to the components of the memory device. In general, the power consumption of a memory device is proportional to the value of $V_{DD}$. Therefore, it is desirable to lower the value of $V_{DD}$ to conserve power in a memory device. Accordingly, device manufacturers are attempting to design memory devices with lower and lower values of $V_{DD}$.

On the other hand, lowering the value of $V_{DD}$ can undesirably lengthen the response time of the sense amplifiers in a memory device or even cause the sense amplifiers to cease operating altogether. The response time of a sense amplifier is generally proportional to the amount of overdrive on the transistors in the sense amplifier. The overdrive on a transistor is controlled by the voltage potential between the gate and the source of the transistor, referred to as $V_{GS}$, in excess of the threshold voltage required to activate the transistor, referred to as $V_T$. In a typical memory array, the voltage on a bit line, referred to as $V_{BL}$, corresponds to $V_{GS}$ for the transistors in the sense amplifier associated with the bit line. Furthermore, the value of $V_{BL}$ is proportional to the value of $V_{DD}$. Therefore, the value of $V_{DD}$ affects the overdrive on the transistors in a sense amplifier, which in turn affects the performance of the sense amplifier. As the value of $V_{DD}$ is lowered, the overdrive on the sense amplifier transistors in the memory array is reduced, which undesirably lengthens the response time of the sense amplifiers.

SUMMARY OF THE INVENTION

In one embodiment, a sense amplifier is coupled to a memory array comprising a power supply, a plurality of memory cells coupled to a first bit line, and a dummy cell coupled to a second bit line. The sense amplifier comprises a first p-channel transistor having a gate, a source coupled to the power supply, and a drain coupled to the second bit line. The sense amplifier further comprises a first n-channel transistor having a gate coupled to the first bit line, a source coupled to an electrical ground voltage, and a drain coupled to the second bit line. The sense amplifier further comprises a first source follower transistor having a gate coupled to the first bit line, a source coupled to the gate of the first p-channel transistor, and a drain coupled to the power supply. The sense amplifier further comprises a first current sink having a gate, a drain coupled to the source of the first source follower transistor, and a source coupled to the electrical ground voltage. The sense amplifier further comprises a second p-channel transistor having a gate, a source coupled to the power supply, and a drain coupled to the first bit line. The sense amplifier further comprises a second n-channel transistor having a gate coupled to the second bit line, a source coupled to an electrical ground voltage, and a drain coupled to the first bit line. The sense amplifier further comprises a second source follower transistor having a gate coupled to the second bit line, a source coupled to the gate of the second p-channel transistor, and a drain coupled to the power supply. The sense amplifier further comprises a second current sink having a gate coupled to the gate of the first current sink, a drain coupled to the source of the second source follower transistor, and a source coupled to the electrical ground voltage.

In another embodiment, a sense amplifier is coupled to a first bit line and to a second bit line, wherein the first bit line is coupled to at least a first storage cell and wherein the second bit line is coupled to at least a second storage cell. The sense amplifier comprises a first source follower having an input coupled to the first bit line and having an output. The sense amplifier further comprises a first transistor having a gate coupled to the first bit line and having a terminal coupled to the second bit line. The sense amplifier further comprises a second transistor having a gate coupled to the output of the first source follower and having a terminal coupled to the second bit line. The sense amplifier further comprises a second source follower having an input coupled to the second bit line and having an output. The sense amplifier further comprises a third transistor having a gate coupled to the second bit line and having a terminal coupled to the first bit line. The sense amplifier further comprises a fourth transistor having a gate coupled to the output of the second source follower and having a terminal coupled to the first bit line.

In another embodiment, a memory device comprises a first memory array comprising a first plurality of storage cells coupled to a first plurality of bit lines and a second memory array comprising a second plurality of storage cells coupled to a second plurality of bit lines. The memory device further comprises a plurality of sense amplifiers, wherein each sense amplifier is coupled to a first bit line and to a second bit line, wherein the first bit line is one of the plurality of bit lines in the first memory array and wherein the second bit line is one of the plurality of bit lines in the second memory array. Each sense amplifier comprises a first source follower having an input coupled to the first bit line and having an output. Each sense amplifier further comprises a first transistor having a gate coupled to the first bit line and having a terminal coupled to the second bit line. Each sense amplifier further comprises a second transistor having a gate coupled to the output of the first source follower and having a terminal coupled to the second bit line. Each sense amplifier further comprises a second source follower having an input coupled to the second bit line and having an output. Each sense amplifier further comprises a third transistor having a gate coupled to the second bit line and having a terminal coupled to the second bit line. Each sense amplifier further comprises a fourth transistor having a gate coupled to the output of the second source follower and having a terminal coupled to the second bit line.

In another embodiment, a computer comprises a memory device having a first memory array comprising a first plurality of storage cells coupled to a first plurality of bit lines, a second memory array comprising a second plurality of storage cells coupled to second plurality of bit lines, and a plurality of sense amplifiers, wherein each sense amplifier is coupled to a first bit line from the first plurality of bit lines and to a second bit line from the second plurality of bit lines. Each sense amplifier comprises a first source follower having an input coupled to the first bit line and having an output. Each sense amplifier further comprises a first transistor having a gate coupled to the first bit line and having a terminal coupled to the second bit line. Each sense amplifier further comprises a second transistor having a gate coupled to the output of the first source follower and having a terminal coupled to the second bit line. Each sense amplifier further comprises a second source follower having an input coupled to the second bit line and having an output. Each sense amplifier further comprises a third transistor having a gate coupled to the second bit line and having a terminal coupled to the second bit line. Each sense amplifier further comprises a fourth transistor having a gate coupled to the output of the second source follower and having a terminal coupled to the second bit line.

In another embodiment, a sense amplifier is coupled to a first bit line and to a second bit line, wherein the first bit line is coupled to a first storage cell and wherein the second bit line is coupled to a second storage cell. The sense amplifier comprises means for shifting the voltage level on the first bit line, the first means for shifting the voltage level on the first bit line having an input coupled to the first bit line and having an output. The sense amplifier further comprises a first transistor having a gate coupled to the first bit line and having a terminal coupled to the second bit line. The sense amplifier further comprises a second transistor having a gate coupled to the output of the means for shifting the voltage level on the first bit line and having a terminal coupled to the second bit line. The sense amplifier further comprises means for shifting the voltage level on the second bit line, the means for shifting the voltage level on the second bit line having an input coupled to the second bit line and having an output. The sense amplifier further comprises a third transistor having a gate coupled to the second bit line and having a terminal coupled to the first bit line. The sense amplifier further comprises a fourth transistor having a gate coupled to the output of the means for shifting the voltage level on the second bit line and having a terminal coupled to the first bit line.

In another embodiment, a method of sensing the state of a memory cell comprises precharging a first bit line coupled to the memory cell and a second bit line coupled to a dummy cell to a predetermined bit line voltage level. The method further comprises coupling a first storage device in the memory cell to the first bit line to produce a voltage on the first bit line and coupling a second storage device in the dummy cell to the second bit line to produce a voltage on the second bit line. The method further comprises providing the voltage on the first bit line to a first transistor in a sense amplifier, shifting the voltage on the first bit line by a selected value to provide a first shifted voltage and providing the first shifted voltage to a second transistor in the sense amplifier. The method further comprises providing the voltage on the second bit line to a third transistor in the sense amplifier, shifting the voltage on the second bit line by the selected value to provide a second shifted voltage and providing the second shifted voltage to a fourth transistor in the sense amplifier. The method further comprises comparing the voltage on the first bit line with the voltage on the second bit line using the sense amplifier and generating an output signal from the sense amplifier responsive to the result of comparing the voltage on the first bit line with the voltage on the second bit line.

In another embodiment, in a sense amplifier comprising a first transistor and a second transistor having a gate of the first transistor cross-coupled to a terminal of the second transistor and comprising a third transistor and a fourth transistor having a gate of the third transistor cross-coupled to a terminal of the fourth transistor, wherein the gate of the first transistor is coupled to a first bit line and wherein the gate of the second transistor is coupled to a second bit line, wherein the first bit line is coupled to a first plurality of storage cells, and wherein the second bit line is coupled to a second plurality of storage cells, the improvement comprises interposing a first voltage level shifter between the first bit line and the third transistor and interposing a second voltage level shifter between the second bit line and the fourth transistor.

DETAILED DESCRIPTION OF THE PREFERRED EMBODIMENTS

Figure 1:
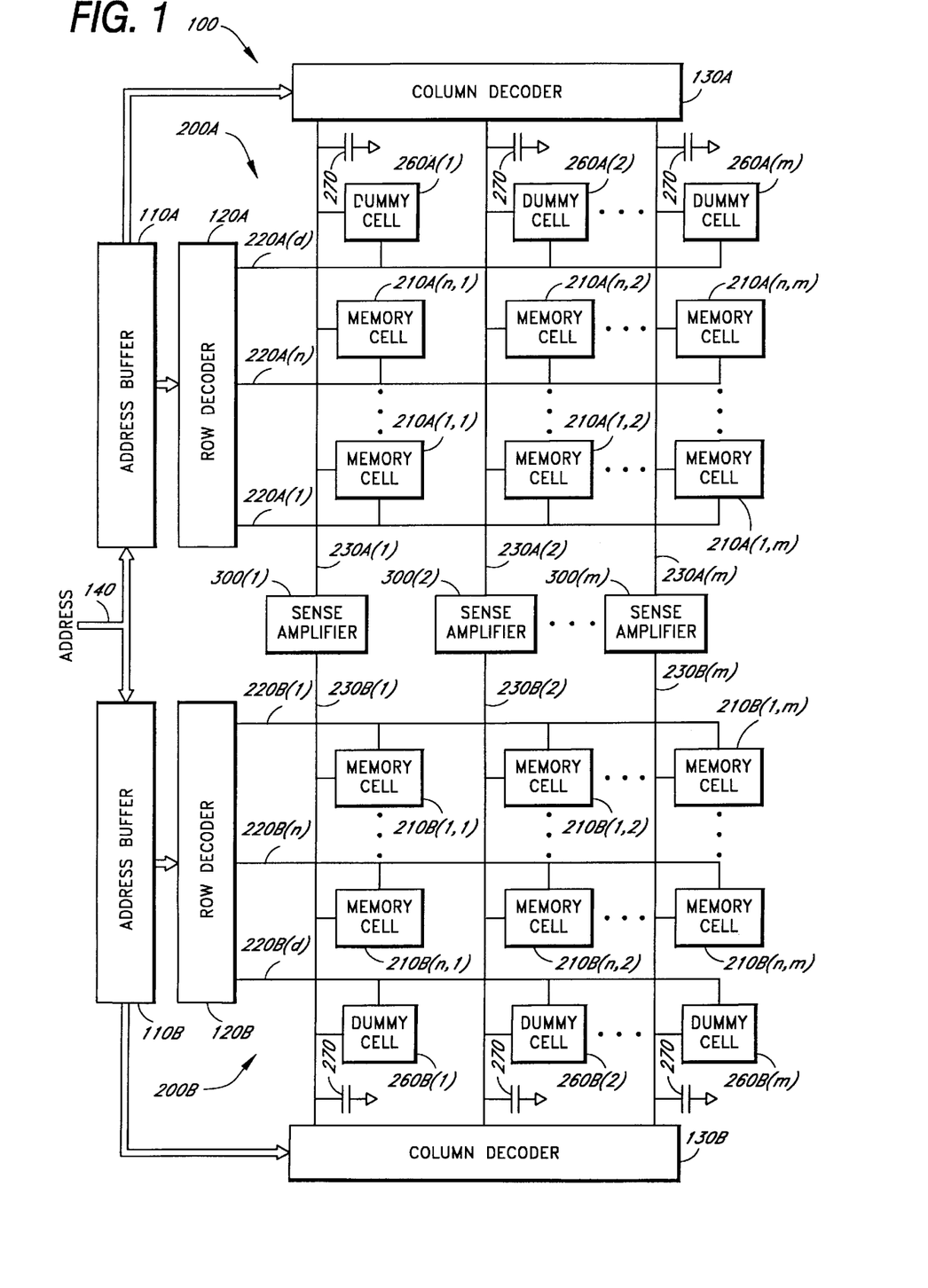
FIG. 1 illustrates one embodiment of an exemplary memory device in accordance with the present invention.

FIG. 1 illustrates one embodiment of an exemplary memory device 100 in accordance with the present invention. Those of ordinary skill in the art will understand that the memory device 100 may comprise any of a number of suitable memory devices, such as a Dynamic Random Access Memory (DRAM) device. As illustrated in FIG. 1, the memory device 100 includes a plurality of memory arrays 200A, 200B. Although only two memory arrays 200A, 200B are shown in FIG. 1, an exemplary memory device 100 may comprise hundreds of memory arrays. The memory arrays 200A, 200B are associated with respective address buffers 110A, 110B, with respective row decoders 120A, 120B, with respective column decoders 130A, 130B, and with a plurality of shared sense amplifiers 300(1)–300(m).

Each memory array 200A, 200B comprises a plurality of memory cells 210A(1,1)–210A(n,m), 210B(1,1)–210B(n,m) coupled to a plurality of intersecting word lines 220A(1)–220A(n), 220B(1)–220B(n) and bit lines 230A(1)–230A(m), 230B(1)–230B(m). In addition, the memory arrays 200A, 200B comprise a plurality of dummy cells 260A(1)–260A(m), 260B(1)–260B(m) coupled to a dummy word line 220A(d), 220B(d) and to the bit lines 230A(1)–230A(m), 230B(1)–230B(m). Although only three word lines and three bit lines are shown in FIG. 1 for each memory array 200A, 200B, an exemplary memory array 200A, 200B may comprise hundreds of word lines and hundreds of bit lines (i.e., m and n are both large numbers).

In one embodiment, the word lines 220A(1)–220A(n), 220B(1)–220B(n), the dummy word lines 220A(d), 220B(d), and the bit lines 230A(1)–230A(m), 230B(1)–230B(m) are fabricated as metal lines on an integrated circuit. Each memory cell 210A(1,1)–210A(n,m), 210B(1,1)–210B(n,m) is associated with one of the word lines 220A(1)–220A(n), 220B(1)–220B(n) and with one of the bit lines 230A(1)–230A(m), 230B(1)–230B(m). Thus, each memory cell 210A(1,1)–210A(n,m), 210B(1,1)–210B(n,m) has an address 140 that uniquely identifies its location in the memory array 200A, 200B based on the intersection of the word line 220A(1)–220A(n), 220B(1)–220B(n) and the bit line 230A(1)–230A(m), 230B(1)–230B(m) associated with the particular memory cell 210A(1,1)–210A(n,m), 210B(1,1)–210B(n,m). In addition, each dummy cell 260A(1)–260A(m), 260B(1)–260B(m) is uniquely identified by the intersection of the dummy word line 220A(d), 220B(d) and a bit line 230A(1)–230A(m), 230B(1)–230B(m). As discussed below, the bit line selected to address a dummy cell during a particular operation is determined by the address 140 that selects the memory cell 210A(1,1)–210A(n,m), 210B(1,1)–210B(n,m).

Figure 2:
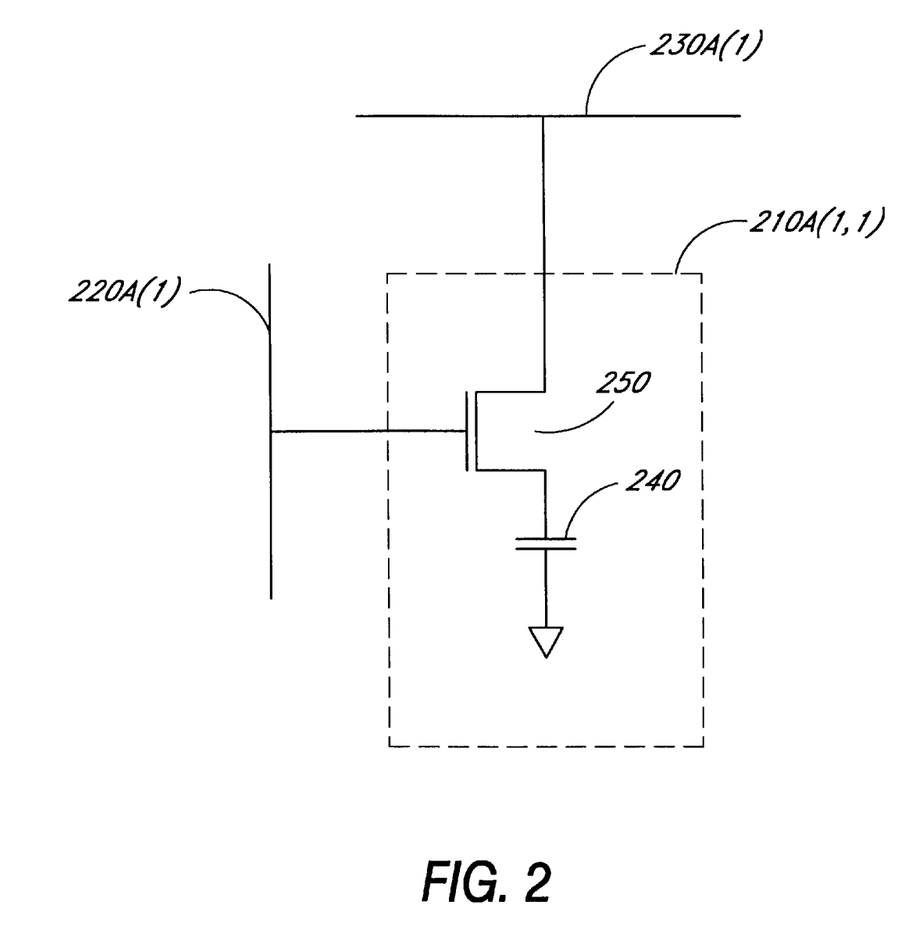
FIG. 2 illustrates one embodiment of a memory cell or a dummy cell.

FIG. 2 illustrates one embodiment of an exemplary memory cell 210A(1,1). The other memory cells 210A(i,j), 210B(i,j) and the dummy cells 260A(j), 260B(j) preferably have the same configuration as the memory cell 210A(1,1) shown in FIG. 2. As illustrated, the memory cell 210A(1,1) comprises a storage device capable of holding a charge, such as a capacitor 240, and an access transistor 250 configured as a switch. The capacitor 240 in each of the dummy cells 260A(1)–260(m), 260B(1)–260B(m) is set to a predetermined state, such as a discharged state.

Each access transistor 250 has a respective gate coupled to a word line associated with the memory cell 210A(1,1) (e.g., the word line 220A(1) shown in FIG. 2). When the access transistor 250 is activated, the capacitor 240 in the memory cell 210A(1,1) becomes electrically coupled to the bit line associated with the memory cell 210A(1,1) (e.g., the bit line 230A(1) shown in FIG. 2).

As shown in FIG. 1, each of the sense amplifiers 300(1)–300(m) is coupled to a pair of bit lines 230A(1)–230A(m), 230B(1)–230B(m). During a read operation, one of the sense amplifiers (e.g., sense amplifier 300(1)) is used to detect the presence or absence of a charge on the capacitor 240 in a particular memory cell (e.g., the memory cell 210A(1,1)) by comparing the voltage on the two bit lines (e.g., the bit lines 230A(1) and 230B(1)) coupled to the sense amplifier 300(1).

The memory arrays 200A, 200B illustrated in FIG. 1 are implemented using an "open" bit line configuration. That is, for each sense amplifier (e.g., the sense amplifier 300(1)), one of the bit lines (e.g., the bit line 230A(1)) coupled to the sense amplifier 300(1) is located within the first memory array 200A, while the other bit line (e.g., the bit line 230B(1)) coupled to the sense amplifier 300(1) is located within the second memory array 200B. Those of ordinary skill in the art will understand that the memory arrays 200A, 200B may also be implemented using a variety of alternative configurations, such as "folded" bit line configuration, in which both bit lines coupled to each sense amplifier are located within the same memory array.

To detect the state of the capacitor 240 in a particular memory cell, such as memory cell 210A(1,1), the memory cell 210A(1,1) is selected, or addressed. The address 140 for the desired memory cell 210A(1,1) is provided to the address buffer 110A, which in turn provides signals representing the address 140 to the row decoder 120A and to the column decoder 130A. When the desired memory cell (e.g., the memory cell 210A(1,1)) is addressed, a corresponding dummy cell (e.g., the dummy cell 260B(1)) is also addressed.

The appropriate dummy cell 260A(1)–260(m), 260B(1)–260B(m) to be addressed is selected based on the memory arrays 200A, 200B coupled to the sense amplifier 300(1)–300(m) for the desired memory cell 210A(1,1). For example, the desired memory cell 210A(1,1) is located within the first memory array 200A and is associated with the first bit line 230A(1), which is coupled to the first sense amplifier 300(1). The first sense amplifier 300(1) is also coupled to the first bit line 230B(1) in the second memory array 200B. Therefore, the dummy cell 260B(1), which is located within the second memory array 200B and is associated with the first bit line 230B(1), is selected as the appropriate dummy cell to be addressed. Thus, when the memory cell 210A(1,1) is addressed, the dummy cell 260B(1) is also addressed. On the other hand, if the memory cell 210B(1,1) were selected as the memory cell to be read, then the dummy cell 260A(1), which is located within the first memory array 200A, would be selected as the appropriate dummy cell to be addressed.

When the memory cell 210A(1,1) and the dummy cell 260B(1) are addressed, the column decoder 130A and the column decoder 130B precharge the bit line 230A(1) and the bit line 230B(1) to a predetermined voltage level, referred to as $V_{BL}$. The row decoder 120A applies a predetermined voltage to the word line 220A(1) coupled to the memory cell 210A(1,1), which activates the access transistors 250 in each of the memory cells 210A(1,1)–210A(1,1) coupled to the selected word line 220A(1). Similarly, the row decoder 120B applies a predetermined voltage to the dummy word line 220B(d), which activates the access transistors 250 in each of the dummy cells 260B(1)–260B(m) in the second memory array 200B.

When the access transistor 250 in the addressed memory cell 210A(1,1) is activated, the capacitor 240 in the memory cell 210A(1,1) becomes electrically coupled to the bit line 230A(1). If the capacitor 240 in the addressed memory cell 210A(1,1) is charged when the access transistor 250 is activated, then the capacitor 240 discharges onto the bit line 230A(1), and the voltage on the bit line 230A(1) changes from $V_{BL}$. On the other hand, if the capacitor 240 in the addressed memory cell 210A(1,1) is not charged when the access transistor 250 is activated, then the voltage on the bit line 230A(1) remains at $V_{BL}$.

Similarly, when the access transistor 250 in the dummy cell 260B(1) is activated, the capacitor 240 in the dummy cell 260B(1) becomes electrically coupled to the bit line 230B(1). If the capacitor 240 in the dummy cell 260B(1) is charged when the access transistor 250 is activated, then the capacitor 240 discharges onto the bit line 230B(1), and the voltage on the bit line 230B(1) changes from $V_{BL}$. On the other hand, if the capacitor 240 in the dummy cell 260B(1) is not charged when the access transistor 250 is activated, then the voltage on the bit line 230B(1) remains at $V_{BL}$.

As described above, the capacitor 240 in each of the dummy cells 260A(1)–260A(m), 260B(1)–260B(m) is set to a predetermined state, such as a discharged state. Because the state of the capacitor 240 in the addressed dummy cell 260B(1) is known, the voltage on the bit line 230B(1) when the access transistor 250 in the dummy cell 260B(1) is activated can be predicted. Therefore, the state of the capacitor 240 in the desired memory cell 210A(1,1) can be detected by comparing the voltage on the bit line 230A(1) with the measured voltage on the bit line 230B(1).

For example, if the capacitor 240 in the dummy cell 260B(1) is preset to a discharged state, then the voltage on the bit line 230B(1) will remain at $V_{BL}$ when the access transistor 250 in the dummy cell 260B(1) is activated. If the capacitor 240 in the memory cell 210A(1,1) is charged, then the voltage on the bit line 230A(1) will change from $V_{BL}$ when the access transistor 250 in the cell 210A(1,1) is activated. Thus, a voltage differential will exist when the voltage on the bit line 230A(1) and the voltage on the bit line 230B(1) are compared. On the other hand, if the capacitor 240 in the memory cell 210A(1,1) is not charged, then the voltage on the bit line 230A(1) will remain at $V_{BL}$ when the access transistor 250 in the memory cell 210A(1,1) is activated. Thus, no voltage differential will exist when the voltage on the bit line 230A(1) and the voltage on the bit line 230B(1) are compared. Accordingly, the state of the capacitor 240 in the memory cell 210A(1,1) can be determined by detecting the presence or the absence of a voltage differential between the bit line 230A(1) and the bit line 230B(1).

Due to the typical size of the memory arrays 200A, 200B, a capacitance 270, referred to as $C_{BL}$, is created on each of the bit lines 230A(1)–230A(m), 230B(1)–230B(m) in the memory arrays 200A, 200B. The capacitance 270 undesirably reduces the magnitude of the voltage differential existing between the bit line 230A(1) and the bit line 230B(1) when the capacitor 240 in the memory cell 210A(1,1) is charged and the capacitor 240 in the dummy cell 210B(1) is not charged, or vice versa. In some embodiments, the capacitance 270 can make the voltage differential between the bit line 230A(1) and the bit line 230B(1) as low as 50 millivolts (mV). Therefore, the sense amplifier 300(1) is configured to detect and amplify a small voltage differential between the bit line 230A(1) and the bit line 230B(1).

Figure 3:
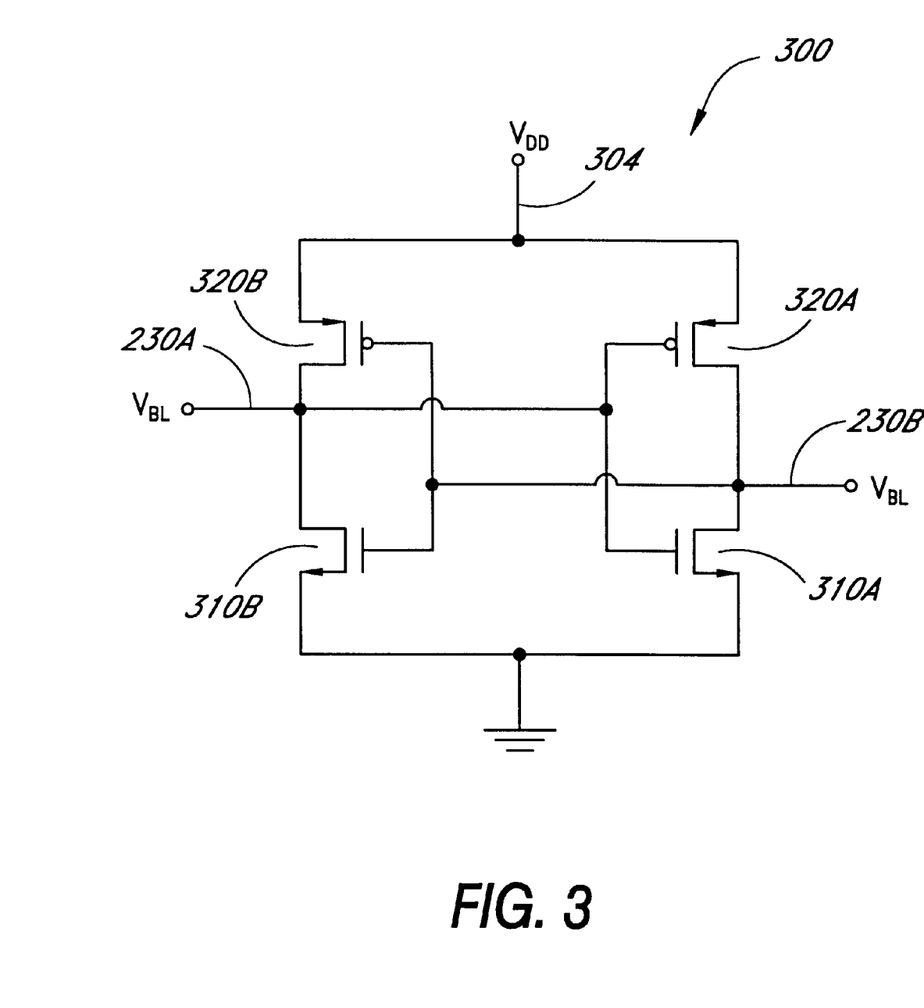
FIG. 3 illustrates one embodiment of a typical sense amplifier.

FIG. 3 illustrates one embodiment of a typical sense amplifier 300. The sense amplifier 300 is coupled to a pair of bit lines 230A, 230B and receives a power supply voltage, $V_{DD}$, via a power supply line 304. The first bit line 230A is coupled to the gate of a first n-channel device 310A and to the gate of a first p-channel device 320A. Similarly, the second bit line 230B is coupled to the gate of a second n-channel device 310B and to the gate of a second p-channel device 320B. In addition, the first bit line 230A is coupled to the drain of the second n-channel device 310B and to the drain of the second p-channel device 320B. Likewise, the second bit line 230B is coupled to the drain of the first n-channel device 310A and to the drain of the first p-channel device 320A. The sources of the two n-channel devices 310A, 310B are both coupled to ground. The sources of the two p-channel devices 320A, 320B are both coupled to the power supply line 304.

When the sense amplifier 300 is sensing the state of a memory cell, the bit lines 230A, 230B are precharged to a predetermined voltage, $V_{BL}$. If the desired memory cell is coupled to the first bit line 230A, then the desired memory cell and the dummy cell coupled to the second bit line 230B are both addressed, as described above. On the other hand, if the desired memory cell is coupled to the second bit line 230B, then the desired memory cell and the dummy cell coupled to the first bit line 230A are both addressed.

For example, if the sense amplifier 300 is sensing the state of a memory cell that is coupled to the first bit line 230A and that has a charged capacitor, then the capacitor discharges onto the first bit line 230A when the memory cell is addressed. The discharge of the capacitor onto the first bit line 230A causes a slight increase in voltage on the first bit line 230A. On the other hand, if the capacitor in the addressed memory cell is not charged, then the voltage on the first bit line 230A remains at $V_{BL}$. As discussed in more detail below, the sense amplifier 300 senses the slight increase in voltage on the first bit line 230A (or absence thereof) by comparing the voltage on the first bit line 230A with the voltage on the second bit line 230B. Thus, the sense amplifier 300 senses the state of the capacitor in the desired memory cell 210. The sense amplifier 300 is configured to detect a slight voltage differential existing between two input voltage signals received via the bit lines 230A, 230B. Furthermore, the sense amplifier 300 is configured to amplify the slight voltage differential to a value of about $V_{DD}$ and to provide two output voltage signals via the bit lines 230A, 230B having the amplified voltage differential.

As an example, if the sense amplifier 300 is sensing the state of a memory cell that is coupled to the first bit line 230A and that has a charged capacitor, then the discharge of the capacitor onto the first bit line 230A causes a slight increase in voltage on the first bit line 230A. A typical value for the slight increase in voltage on the first bit line 230A caused by the discharge of the capacitor is about 50 mV. If the capacitor in the dummy cell coupled to the second bit line 230B is preset to a discharged state, then the voltage on the second bit line 230B remains at $V_{BL}$. The sense amplifier is configured to detect the voltage differential of about 50 mV existing between the first bit line 230A and the second bit line 230B. If the value of $V_{DD}$ is about 1.8 V, then the sense amplifier 300 amplifies the 50 mV voltage differential to a voltage differential of about 1.8 V. The sense amplifier 300 provides two output voltage signals via the bit lines 230A, 230B with a voltage differential of about 1.8 V existing between them.

Those of ordinary skill in the art will understand that the magnitude of the voltage differential between the output voltage signals of the sense amplifier 300 asymptotically approaches a final value, such as the value of about $V_{DD}$, over time. The time that it takes the magnitude of the voltage differential between the output voltage signals of the sense amplifier 300 to reach 80% of its final value is referred to as the "response time" of the sense amplifier 300.

As discussed above, the power consumption of a memory device 100 is generally proportional to the value of $V_{DD}$. Therefore, device manufacturers are attempting to design memory devices with lower and lower values of $V_{DD}$ to conserve power consumption in the memory device 100. However, as the value of $V_{DD}$ is lowered, the response time of the sense amplifier 300 is undesirably lengthened.

Each of the devices 310A, 310B, 320A, 320B in the sense amplifier 300 becomes activated when the voltage applied between the gate and the source of each device 310A, 310B, 320A, 320B, referred to as VGS, exceeds a certain threshold voltage, referred to as $V_T$. The response time of the sense amplifier 300 is generally proportional to the amount of "overdrive" on the devices 310A, 310B, 320A, 320B in the sense amplifier 300. The overdrive on the devices 310A, 310B, 320A, 320B is controlled by the value of VGS in excess of $V_T$, or $V_{GS}-V_T$. As illustrated in FIG. 2, $V_{GS}$ corresponds to $V_{BL}$ for both of the n-channel devices 310A, 310B in the sense amplifier 300. Furthermore, $V_{GS}$ corresponds to the difference between $V_{DD}$ and $V_{BL}$, or $V_{DD}-V_{BL}$, for both of the p-channel devices 320A, 320B in the sense amplifier 300. Thus, the amount of overdrive on the n-channel devices 310A, 310B in the sense amplifier 300 is $V_{BL}-V_T$, and the amount of overdrive on the p-channel devices 320A, 320B in the sense amplifier 300 is $(V_{DD}-V_{BL})-V_T$.

In a typical memory device 100, the value of $V_{BL}$ is proportional to the value of $V_{DD}$. For example, in one typical configuration, the value of $V_{BL}$ is ½ the value of $V_{DD}$. In this configuration, the amount of overdrive on each the devices 310A, 310B, 320A, 320B in the sense amplifier 300 is ½ $V_{DD}-V_T$. Therefore, as the value of $V_{DD}$ is lowered, the overdrive on the devices 310A, 310B, 320A, 320B in the sense amplifier 300 is reduced, which undesirably lengthens the response time of the sense amplifier 300. In fact, as the value of $V_{DD}$ approaches 2 $V_T$, the devices 310A, 310B, 320A, 320B in the sense amplifier 300 may cease operating altogether.

As an example, if the value of $V_T$ for the devices 310A, 310B, 320A, 320B in the sense amplifier 300 is about 0.5 volts (V) and the value of $V_{DD}$ is about 1.8 V, then the response time for the sense amplifier 300 is about 10 nanoseconds (ns). However, if the value of $V_{DD}$ is lowered to about 1.4 V, then the response time for the sense amplifier 300 is lengthened to about 20 ns. Furthermore, if the value of $V_{DD}$ is lowered to about 1.2 V, then the response time for the sense amplifier 300 is further lengthened to about 35 ns. Finally, if the value of $V_{DD}$ is lowered to about 1.0 V, then the devices 310A, 310B, 320A, 320B in the sense amplifier 300 cease operating altogether.

Merely maintaining the value of $V_{BL}$ as the value of $V_{DD}$ is lowered does not adequately address the problem of increasing response times for the sense amplifier 300. For example, in the first example provided above, the value of $V_{BL}$ is typically set to ½ $V_{DD}$, or 0.9 V. If the value of $V_{BL}$ is kept at 0.9 V as the value of $V_{DD}$ is lowered to 1.2 V, for example, then the value of $V_{GS}$ for the p-channel devices 320A, 320B is 1.2 V–0.9 V, or 0.3 V. Because this value of $V_{GS}$ is less than the value of $V_T$, the p-channel devices 320A, 320B would not even be activated, and the sense amplifier 300 would not function properly.

Figure 4:
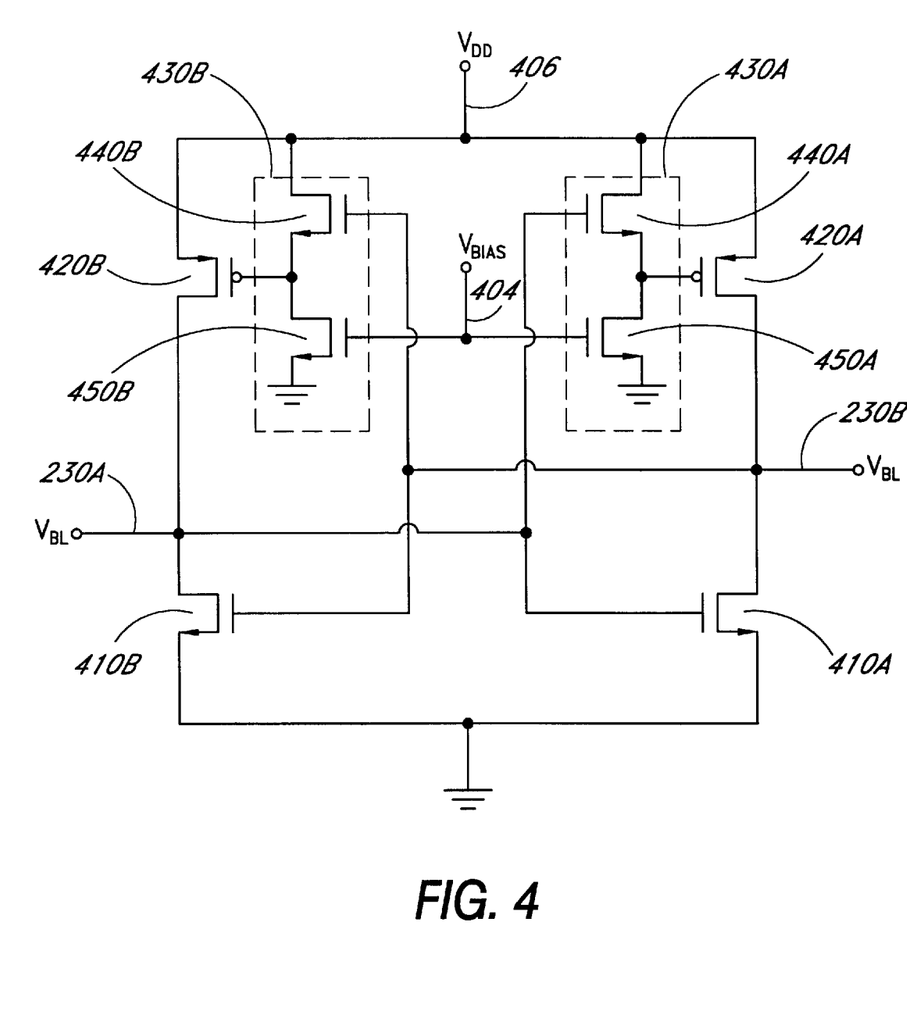
FIG. 4 illustrates one embodiment of a sense amplifier in accordance with the present invention.

FIG. 4 illustrates one embodiment of a sense amplifier 300 in accordance with the present invention. The sense amplifier 300 is coupled to a pair of bit lines 230A, 230B. Furthermore, the sense amplifier 300 receives a bias voltage, referred to as $V_{BIAS}$, via a bias voltage supply line 404 and receives a power supply voltage, $V_{DD}$, via a power supply line 406. The first bit line 230A is coupled to the gate of a first n-channel device 410A directly and coupled to the gate of a first p-channel device 420A through a first source follower 430A. Similarly, the second bit line 230B is coupled to the gate of a second n-channel device 410B directly and coupled to the gate of a second p-channel device 420B through a second source follower 430B. In addition, the first bit line 230A is coupled to the drain of the second n-channel device 410B and to the drain of the second p-channel device 420B. Likewise, the second bit line 230B is coupled to the drain of the first n-channel device 410A and to the drain of the first p-channel device 420A. The sources of the two n-channel devices 410A, 410B are both coupled to ground. The sources of the two p-channel devices 420A, 420B are both coupled to the power supply line 406.

The source followers 430A, 430B both comprise an n-channel device 440A, 440B and a current sink 450A, 450B. The drains of the n-channel devices 440A, 440B are both coupled to the power supply line 406. In the illustrated embodiment, the current sinks 450A, 450B are implemented as n-channel devices having respective sources coupled to ground and having a predetermined bias voltage, $V_{BIAS}$, applied between the gates and sources of the devices. The drains of the current sinks 450A, 450B are coupled to the respective sources of the n-channel devices 440A, 440B and to the respective gates of the p-channel devices 420A, 420B. Although the current sinks 450A, 450B are shown as n-channel devices, those of ordinary skill in the art will understand that a number of other suitable implementations exist for the current sinks 450A, 450B.

The first bit line 230A is coupled to the gate of the n-channel device 440A in the first source follower 430A. The source of the n-channel device 440A and the drain of the current sink 450A in the first source follower 430A are coupled to the gate of the first p-channel device 420A. When the n-channel device 440A in the first source follower 430A is active, a voltage drop, referred to as $V_{GSSFA}$, exists between the gate and the source of the n-channel device 440A. The value of $V_{GSSFA}$ is controlled by the current flowing through the current sink 450A in the first source follower 430A, which is controlled by the magnitude of $V_{BIAS}$.

Similarly, the second bit line 230B is coupled to the gate of the n-channel device 440B in the second source follower 430B. The source of the n-channel device 440B and the drain of the current sink 450B in the second source follower 430B are coupled to the gate of the second p-channel device 420B. When the n-channel device 440B in the second source follower 430B is active, a voltage drop, $V_{GSSFB}$, exists between the gate and the source of the n-channel device 440B. The value of $V_{GSSFB}$ is controlled by the current flowing through the current sink 450B in the second source follower 430B, which is controlled by the magnitude of $V_{BIAS}$.

By including the source followers 430A, 430B in the sense amplifier 300, the amount of overdrive on the devices 410A, 410B, 420A, 420B advantageously remains constant as memory devices are designed with lower and lower values of $V_{DD}$. The amount of overdrive on the devices 410A, 410B, 420A, 420B remains constant because the value of $V_{BL}$ is maintained at a constant level while the value of $V_{DD}$ is lowered. The value of $V_{BL}$ can be kept constant because the value of $V_{GS}$ for the p-channel devices 420A, 420B is $V_{DD}-(V_{BL}-V_{GSSF})$, rather than $V_{DD}-V_{BL}$, as in the above example. Thus, by selecting the values of $V_{GSSFA}$ and $V_{GSSFB}$, the value of $V_{GS}$ for the p-channel devices 420A, 420B remains constant even though the value of $V_{DD}$ is lowered and the value of $V_{BL}$ remains constant. Because the values of $V_{GSSFA}$ and $V_{GSSFB}$ are selected by adjusting the value of $V_{BIAS}$, the source followers 430A, 430B act as variable voltage level shifters interposed between the bit lines 230A, 230B and p-channel devices 420A, 420B.

As an example, if the value of $V_T$ for the devices 410A, 410B, 420A, 420B in the sense amplifier 300 is about 0.5 volts (V) and the value of $V_{DD}$ is about 1.8 V, then the value of $V_{BL}$ is typically set to ½ $V_{DD}$, or about 0.9 V. If $V_{GSSFA}$ and $V_{GSSFB}$ are set to zero, then the value of $V_{GS}$ for each of the devices 410A, 410B, 420A, 420B is 0.9 V. If the value of $V_{DD}$ is lowered to about 1.2 V and the value of $V_{BL}$ is kept at 0.9 V without varying the values of $V_{GSSFA}$ and $V_{GSSFB}$, then the value of VGS for the p-channel devices 420A, 420B is 1.2 V–0.9 V, or 0.3 V. However, if the value of $V_{BIAS}$ is adjusted to set the values of $V_{GSSFA}$ and $V_{GSSFB}$ at 0.6 V, then the value of $V_{GS}$ for the p-channel devices 420A, 420B would be 1.2 V–(0.9 V–0.6 V), or 0.9 V.

Thus, the value of $V_{GS}$ for the p-channel devices 420A, 420B remains constant even though the value of $V_{DD}$ is lowered and the value of $V_{BL}$ remains constant. Because the value of $V_{GS}$ remains constant as the value of $V_{DD}$ is lowered, the amount of overdrive on the devices 410A, 410B, 420A, 420B remains constant as well. Hence, the value of $V_{DD}$ can advantageously be lowered to conserve power in the memory device 100 without adversely affecting the response time of the sense amplifier 300.

Although the foregoing has been a description and illustration of specific embodiments of the invention, various modifications and changes can be made thereto by persons skilled in the art, without departing from the scope and spirit of the invention as defined by the following claims.

What is claimed is:

1. A sense amplifier coupled to a memory array comprising a power supply, a plurality of memory cells coupled to a first bit line, and a dummy cell coupled to a second bit line, said sense amplifier comprising:
   a first p-channel transistor having a gate, a source coupled to said power supply, and a drain coupled to said second bit line;
   a first n-channel transistor having a gate coupled to said first bit line, a source coupled to an electrical ground voltage, and a drain coupled to said second bit line;
   a first source follower transistor having a gate coupled to said first bit line, a source coupled to said gate of said first p-channel transistor, and a drain coupled to said power supply;
   a first current sink having a gate, a drain coupled to said source of said first source follower transistor, and a source coupled to said electrical ground voltage;
   a second p-channel transistor having a gate, a source coupled to said power supply, and a drain coupled to said first bit line;
   a second n-channel transistor having a gate coupled to said second bit line, a source coupled to an electrical ground voltage, and a drain coupled to said first bit line;
   a second source follower transistor having a gate coupled to said second bit line, a source coupled to said gate of said second p-channel transistor, and a drain coupled to said power supply; and
   a second current sink having a gate coupled to said gate of said first current sink, a drain coupled to said source of said second source follower transistor, and a source coupled to said electrical ground voltage.

2. A sense amplifier coupled to a first bit line and to a second bit line, wherein said first bit line is coupled to at least a first storage cell and wherein said second bit line is coupled to at least a second storage cell, said sense amplifier comprising:
   a first source follower having an input coupled to said first bit line and having an output;
   a first transistor having a gate coupled to said first bit line and having a terminal coupled to said second bit line;
   a second transistor having a gate coupled to said output of said first source follower and having a terminal coupled to said second bit line;
   a second source follower having an input coupled to said second bit line and having an output;
   a third transistor having a gate coupled to said second bit line and having a terminal coupled to said first bit line; and
   a fourth transistor having a gate coupled to said output of said second source follower and having a terminal coupled to said first bit line.

3. The sense amplifier of claim 2, wherein said first and third transistors are n-channel transistors and wherein said second and fourth transistors are p-channel transistors.

4. The sense amplifier of claim 3, wherein said terminals of said first, second, third and fourth transistors are drains of said transistors.

5. The sense amplifier of claim 2, wherein said first source follower comprises a first current sink and a first source follower transistor having a gate coupled to said first bit line and wherein said second source follower comprises a second current sink and a second source follower transistor having a gate coupled to said second bit line.

6. The sense amplifier of claim 5, wherein a first current flowing through said first current sink is adjusted to vary the value of a first voltage drop voltage drop across a gate and a source of said first source follower transistor and wherein a second current flowing through said second current sink is adjusted to vary the value of a second voltage drop voltage drop across a gate and a source of said second source follower transistor.

7. The sense amplifier of claim 5, wherein said first current sink and said second current sink each comprise a sink transistor having a predetermined bias voltage applied between a gate and a terminal of said sink transistor.

8. The sense amplifier of claim 7, wherein said sink transistor comprises an n-channel transistor and said terminal of said sink transistor comprises a drain of said sink transistor.

9. The sense amplifier of claim 2, wherein said at least a first storage cell comprises a storage device and an access transistor and wherein said at least a second storage cell comprises a storage device and an access transistor.

10. The sense amplifier of claim 2, wherein said at least a first storage cell coupled to said first bit line comprises a first plurality of memory cells and a first dummy cell and wherein said at least a second storage cell coupled to said second bit line comprises a second plurality of memory cells and a second dummy cell.

11. A memory device, comprising:
    a first memory array comprising a first plurality of storage cells coupled to a first plurality of bit lines;
    a second memory array comprising a second plurality of storage cells coupled to a second plurality of bit lines; and
    a plurality of sense amplifiers, wherein each sense amplifier is coupled to a first bit line and to a second bit line, wherein said first bit line is one of said plurality of bit lines in said first memory array and wherein said second bit line is one of said plurality of bit lines in said second memory array, each sense amplifier comprising:
       a first source follower having an input coupled to said first bit line and having an output,
       a first transistor having a gate coupled to said first bit line and having a terminal coupled to said second bit line,
       a second transistor having a gate coupled to said output of said first source follower and having a terminal coupled to said second bit line, a second source follower having an input coupled to said second bit line and having an output, a third transistor having a gate coupled to said second bit line and having a terminal coupled to said second bit line, and a fourth transistor having a gate coupled to said output of said second source follower and having a terminal coupled to said second bit line.

12. The memory device of claim 11, wherein said first plurality of storage cells comprises at least one memory cell and said second plurality of storage cells comprises at least one dummy cell, said dummy cell having a predetermined value stored therein.

13. The memory device of claim 11, wherein said first and third transistors comprise n-channel transistors and said second and fourth transistors comprise p-channel transistors.

14. A computer, comprising:

a memory device having a first memory array comprising a first plurality of storage cells coupled to a first plurality of bit lines, a second memory array comprising a second plurality of storage cells coupled to second plurality of bit lines, and a plurality of sense amplifiers, wherein each sense amplifier is coupled to a first bit line from said first plurality of bit lines and to a second bit line from said second plurality of bit lines, each sense amplifier comprising:

a first source follower having an input coupled to said first bit line and having an output, a first transistor having a gate coupled to said first bit line and having a terminal coupled to said second bit line, a second transistor having a gate coupled to said output of said first source follower and having a terminal coupled to said second bit line, a second source follower having an input coupled to said second bit line and having an output, a third transistor having a gate coupled to said second bit line and having a terminal coupled to said second bit line, and a fourth transistor having a gate coupled to said output of said second source follower and having a terminal coupled to said second bit line.

15. The computer of claim 14, wherein said first and third transistors comprise n-channel transistors and said second and fourth transistors comprise p-channel transistors.

16. A sense amplifier coupled to a first bit line and to a second bit line, wherein said first bit line is coupled to a first storage cell and wherein said second bit line is coupled to a second storage cell, said sense amplifier comprising:

means for shifting the voltage level on said first bit line, said means for shifting the voltage level on said first bit line having an input coupled to said first bit line and having an output;

a first transistor having a gate coupled to said first bit line and having a terminal coupled to said second bit line;

a second transistor having a gate coupled to said output of said means for shifting the voltage level on said first bit line and having a terminal coupled to said second bit line;

means for shifting the voltage level on said second bit line, said means for shifting the voltage level on said second bit line having an input coupled to said second bit line and having an output;

a third transistor having a gate coupled to said second bit line and having a terminal coupled to said first bit line; and a fourth transistor having a gate coupled to said output of said means for shifting the voltage level on said second bit line and having a terminal coupled to said first bit line.

17. The memory device of claim 16, wherein said first and third transistors comprise n-channel transistors and said second and fourth transistors comprise p-channel transistors.

18. A method of sensing the state of a memory cell, comprising:

precharging a first bit line coupled to said memory cell and a second bit line coupled to a dummy cell to a predetermined bit line voltage level;

coupling a first storage device in said memory cell to said first bit line to produce a voltage on said first bit line;

coupling a second storage device in said dummy cell to said second bit line to produce a voltage on said second bit line;

providing the voltage on said first bit line to a first transistor in a sense amplifier;

shifting the voltage on the first bit line by a selected value to provide a first shifted voltage and providing the first shifted voltage to a second transistor in said sense amplifier;

providing the voltage on said second bit line to a third transistor in said sense amplifier;

shifting the voltage on the second bit line by said selected value to provide a second shifted voltage and providing the second shifted voltage to a fourth transistor in said sense amplifier;

comparing the voltage on the first bit line with the voltage on the second bit line using said sense amplifier; and generating an output signal from said sense amplifier responsive to the result of comparing the voltage on the first bit line with the voltage on the second bit line.

19. In a sense amplifier comprising a first transistor and a second transistor having a gate of said first transistor cross-coupled to a terminal of said second transistor and comprising a third transistor and a fourth transistor having a gate of said third transistor cross-coupled to a terminal of said fourth transistor, wherein said gate of said first transistor is coupled to a first bit line and wherein said gate of said second transistor is coupled to a second bit line, wherein said first bit line is coupled to a first plurality of storage cells, and wherein said second bit line is coupled to a second plurality of storage cells, the improvement comprising:

interposing a first voltage level shifter between said first bit line and said third transistor; and interposing a second voltage level shifter between said second bit line and said fourth transistor.

* * * * *

UNITED STATES PATENT AND TRADEMARK OFFICE
CERTIFICATE OF CORRECTION

PATENT NO.    : 6,198,681 B1
DATED         : March 6, 2001
INVENTOR(S)   : Leonard Forbes It is certified that error appears in the above-identified patent and that said Letters Patent is hereby corrected as shown below:

<u>Column 12, claim 6,</u>
Line 3, after the word "first" please delete the first [voltage drop]
Line 6, after the word "second" please delete the first [voltage drop]

Signed and Sealed this

Fourth Day of December, 2001

Attest:

NICHOLAS P. GODICI
*Acting Director of the United States Patent and Trademark Office*

*Attesting Officer*